Jan. 17, 1956 A. C. SCHROEDER 2,731,563

STABILIZATION BY MOLECULAR BEAMS

Filed Oct. 10, 1950 2 Sheets-Sheet 1

INVENTOR
Alfred C. Schroeder
BY
ATTORNEY

Jan. 17, 1956 A. C. SCHROEDER 2,731,563

STABILIZATION BY MOLECULAR BEAMS

Filed Oct. 10, 1950 2 Sheets-Sheet 2

INVENTOR
Alfred C. Schroeder
BY
[signature]
ATTORNEY

United States Patent Office 2,731,563

Patented Jan. 17, 1956

2,731,563

STABILIZATION BY MOLECULAR BEAMS

Alfred C. Schroeder, Southampton, Pa., assignor to Radio Corporation of America, a corporation of Delaware Application October 10, 1950, Serial No. 189,315

8 Claims. (Cl. 250—36)

This invention relates to frequency controlled oscillators.

In the prior art the frequency of an oscillator is often controlled by a tube placed across the tank circuit of the oscillator. The grid of the control tube is supplied with voltage that is in phase quadrature with the voltage appearing on the oscillator grid. In this way the tube acts as either a capacitive or an inductive reactance in parallel with the tuned circuit of the oscillator. Changes in frequency are brought about by varying the gain of the reactance tube. In such an arrangement, however, the reactance tube is used solely for a control purpose and is of no aid in increasing the maximum available power output of the oscillator.

It is therefore an object of this invention to provide an improved frequency controlled oscillator.

It is another object of this invention to provide a frequency controlled oscillator in which the means for controlling the frequency is adapted to strengthen the oscillations.

In certain applications it is necessary to derive three phase voltage waves. Generally, this has been accomplished by applying the output of a frequency controlled oscillator to a phase splitter. For example, in a dot multiplex color television system, each of three different channels is opened successively. This is generally accomplished by applying differently phased voltage waves of the same frequency to appropriate gating circuits. The sampling or gating frequency is derived from any standard type of oscillator and applied to a phase splitter which may be comprised of delay lines.

It is accordingly another object of this invention to provide an improved multi-phase oscillator that supplies voltage waves of different phases without requiring a phase splitter.

In many cases it is desirable that the apparatus for controlling the frequency of an oscillator have a maximum sensitivity. In accordance with another feature of this invention, the sensitivity of the frequency control is many times that obtained by the use of normal reactance tube frequency control circuits.

Briefly, the objectives and advantages noted above may be achieved as follows. The controlled frequency oscillator that is the subject of this invention is comprised of two separate delay line oscillators each having a different frequency. The plates of the oscillator tubes are tied together, and the cathodes of the oscillator tubes are tied together. The current flowing through one of the tubes has a frequency determined by the length of the delay line between its plate and its grid. In a similar way, the frequency of the current flowing through the other oscillator tube is determined by the length of delay line between its plate and its grid. Because the currents are added, however, the resulting frequency across the common linear plate load circuit lies half way between the frequencies of the two oscillators. This holds true only in the case where the amplitude of oscillations provided by each of the oscillator tubes is the same. However, by changing the gain of one of the tubes with respect to the other, the resultant frequency or the phase of the resultant frequency can be changed.

In this novel combination it will be noted that the change in frequency is effected by change in the contribution made to the resultant frequency by one of the oscillators.

The maximum available power is twice that normally supplied by an oscillator having its frequency controlled by a reactance tube for the reason that in the former case each of two tubes supplies both frequency control and oscillation energy, whereas in the latter case the reactance tube furnishes no power to the oscillations but merely provides frequency control.

The manner in which the above objectives may be achieved in accordance with the principles of this invention will be better understood from a detailed consideration of the drawings in which.

Figures 1, 2, 3, 4:
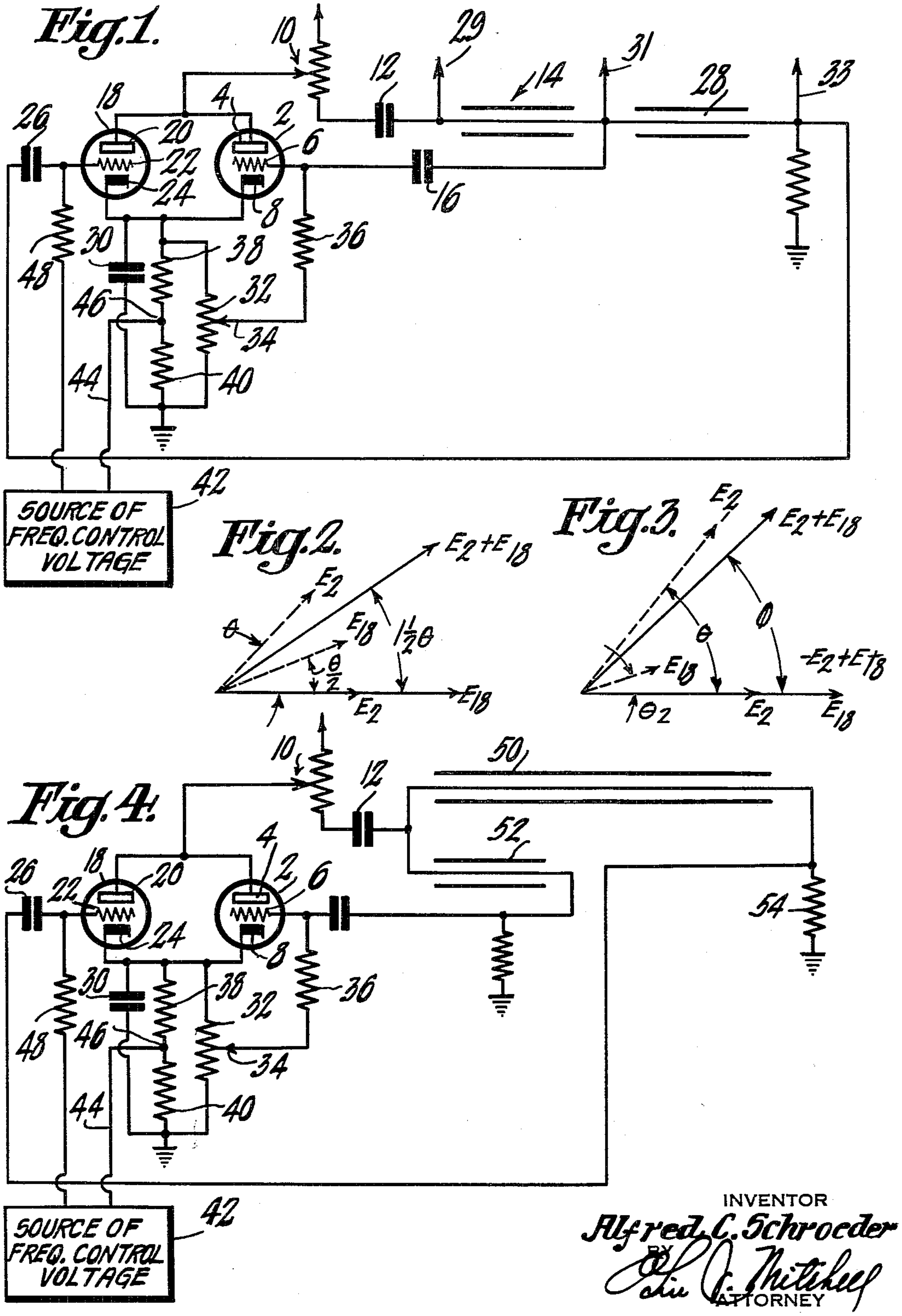
Figure 1 shows in schematic form a control frequency oscillator wherein a portion of a delay line is common to both oscillator circuits.
Figures 2 and 3 are vector diagrams for reference in explaining the operation of the invention.
Figure 4 illustrates in schematic form a control frequency oscillator wherein separate delay lines are employed in each oscillator circuit.

Referring to Figure 1 in detail then, there are shown two delay line oscillators connected as follows. The first oscillator is comprised of an amplifier 2 having at least a plate 4, a grid 6 and a cathode 8. The plate is supplied with a suitable amount of positive potential by a potentiometer 10. The lower end of the potentiometer winding is coupled via a blocking condenser 12 to a first delay line 14. The grid 6 of the amplifier 2 is coupled via a condenser 16 to the other end of the delay line 14.

An amplifier 18 supplies the gain required in a second oscillator and is comprised of at least a plate 20, a grid 22 and a cathode 24. The plate 20 is connected directly to the plate 4 of the amplifier 2 that provides the gain in the other oscillator. Therefore, the plate 20 is also connected to the movable arm of the potentiometer 10. The cathode 24 of the amplifier 18 is connected directly to the cathode 8 of the amplifier tube 2. The grid 22 of the amplifier 18, however, is coupled via a condenser 26 to one end of another delay line 28. The opposite end of the delay line 28 is connected to the grid end of the delay line 14. Different phases of the resultant frequency appearing across the delay line may be derived at taps 29, 31 and 33. Any number of taps may be located at any number of points in the delay lines 14 and 28.

The cathodes 24 and 8 of the amplifiers 18 and 2 respectively are connected to ground by the parallel combination of a by-pass condenser 30, a potentiometer 32 having a movable arm 34 and a pair of series connected resistors 38 and 40. The movable arm 34 is connected to the grid 6 of the amplifier 2 via a grid leak resistor 36. A source 42 of frequency control voltage is connected between the junction 46 of the resistors 38 and 40 and the lower end of a grid leak resistor 48. The other end of the grid leak resistor 48 is connected to the grid 22 of the amplifier 18.

The general operation of the apparatus illustrated in Figure 1 will now be discussed in connection with the vector diagram shown in Figures 2 and 3. It has been previously stated that the combined frequency controlled oscillator that is the subject of this invention is comprised of two oscillators operating at different frequencies. The amplifier 2 and the delay line 14 are component parts of one oscillator and the amplifier 18 and the delay lines 14 and 28 are components of another oscillator. The outputs of these oscillators are available at their plates 4 and 20, respectively. Because the plates are tied together, a potential coupled to the delay lines 14 and 28 by the condenser 12 is the sum of the two oscillations. The frequency resultant of the two oscillations is equal to the average of the frequencies of the oscillators providing the amplitude of both oscillations is the same. This can be illustrated in detail by reference to the vector diagram of Figure 2 wherein $E_2$ indicates the plate voltage available at the oscillator tube 2 and $E_{18}$ represents the plate voltage supplied by the oscillator tube 18. Assume that these two voltages $E_2$ and $E_{18}$ are equal and in phase at one instant of time as shown in the diagram. After a given increment of time the voltage $E_2$ having a higher frequency, will rotate through an angle $\theta$ to a position indicated by a dotted vector $E_2$. Assume that the lower frequency voltage $E_{18}$ has a frequency one-half of the frequency $E_2$. It will be rotated through the same increment of time through an angle $$\frac{\theta}{2}$$

to a position indicated by a dotted vector $E_{18}$. At the beginning of this increment of time the resultant of $E_2+E_{18}$ was in a horizontal position as shown. After this increment of time, however, the resultant will rotate through an angle $1\frac{1}{2}\ \theta$ to a position indicated by the solid vector $E_2+E_{18}$. It is therefore apparent that the frequency of rotation of the resultant of the different frequency voltages $E_2$ and $E_{18}$ has a frequency that is the average of the frequencies $E_2$ and $E_{18}$.

In the explanation of the operation given above, it was assumed that the voltages supplied by the oscillator tubes 2 and 18 were of equal amplitude. Assume, however, that the voltage supplied by the source 42 to the grid 22 of the oscillator tube 18 is such that the amplitude of oscillations provided by the oscillator tube 18 exceeds the amplitude of the oscillations provided by the oscillator tube 2. At time equals zero then the vectors point in the same direction as indicated by the horizontal vectors $E_2$ and $E_{18}$ in Figure 3. If the frequency of the vector $E_2$ is twice of the vector $E_{18}$, the vector $E_2$ will rotate through an angle $\theta$ to a position indicated by the dotted vector $E_2$ and the vector $E_{18}$ will rotate through an angle $$\frac{\theta}{2}$$

to a position indicated by the dotted vector $E_{18}$ in a given increment of time. The resultant of these two vectors is indicated by a solid vector $E_2+E_{18}$. This vector represents the resultant of the vectors $E_2$ and $E_{18}$ and it has shifted through an angle $\phi$ during the same increment of time. It is apparent that the angle $\phi$ is greater than $1\frac{1}{2}$ times the angle $\theta$. Accordingly, the frequency of the resultant of the voltages supplied by the two oscillators has been increased by increasing the magnitude of the oscillations supplied by one of them.

In delay line oscillators the time duration of a half cycle is generally approximately the same as the delay time provided by the delay line. However, in this particular application the only frequency existing on the delay lines 14 and 28 is the resultant frequency $E_2+E_{18}$ as indicated above. The phase of the voltage fed back to the grid 6 of the oscillator tube 2 from the junction of the two delay lines 14 and 28 is therefore not exactly 180° out-of-phase with the plate voltage of this tube. However, a sufficient component of voltage that is 180° out-of-phase is applied by this connection so as to maintain oscillations. In a similar manner the voltage applied from the end of the delay line 28 to the grid 22 of the oscillator tube 18 is not quite 180° out with the plate voltage but has a sufficient component which is 180° out with the plate voltage to maintain oscillations in this tube.

However, the frequencies of the two oscillators are dependent on the lengths of the delay lines 14 and 28 and assuming that the amplitude of oscillations in both oscillators is the same, the frequency range over which the resultant frequency can be varied is dependent on the length of the delay line 28. The common cathode circuit comprised of the condenser 30, the resistors 38 and 40, and the potentiometer 32 will be discussed in connection with the practicable operation of the device. The control voltage supplied by the source 42 will swing positively and negatively with respect to the junction 46 between the series resistors 38 and 40. If the oscillator tubes had the same inherent gain and if the resistors 38 and 40 are equal, the potentiometer arm 34 would be in a middle position as the bias applied by it to the grid 6 of the oscillator tube 2 would be the same as the bias applied to the grid 22 via the lead 44. It is readily apparent to those skilled in the art that the inherent gains of the oscillator tubes 2 and 18 often differ and therefore the movable arm 34 of potentiometer 32 may be adjusted so as to compensate for this factor.

Figure 4 illustrates a controlled frequency oscillator that is similar to the control frequency oscillator shown in Figure 1. For this reason, corresponding components will be indicated by the same numeral. The difference lies in the fact that two delay lines are used separately, one in each oscillator circuit, as distinguished from the arrangement of Figure 1 where the delay line 14 is common to both oscillator circuits. The coupling condenser 12 is coupled by a delay line 50 to the grid 22 of the oscillator tube 18. It is also coupled via a separate delay line 52 to the grid 6 of the oscillator tube 2. No difference in operation results from this particular arrangement.

Under some conditions, it may be desirable to obtain more widely spaced phases of the resultant voltage $E_2+E_{18}$ than would be available if the whole of each delay line is a part of the oscillator circuit. Any of the delay lines shown in either Figure 1 or Figure 4 may be extended as the delay line 50 is extended in Figure 4. This extension 52 is terminated by a characteristic impedance 54 so that no reflections will interfere with the operation of the oscillator. However, the section 52 can have sufficient delay that the phase of the resultant voltage wave across the terminating resistor 54 may be 360° away from the phase of the resultant voltage wave applied to the other end of the delay line 50 via the coupling condenser 12.

Figure 5:
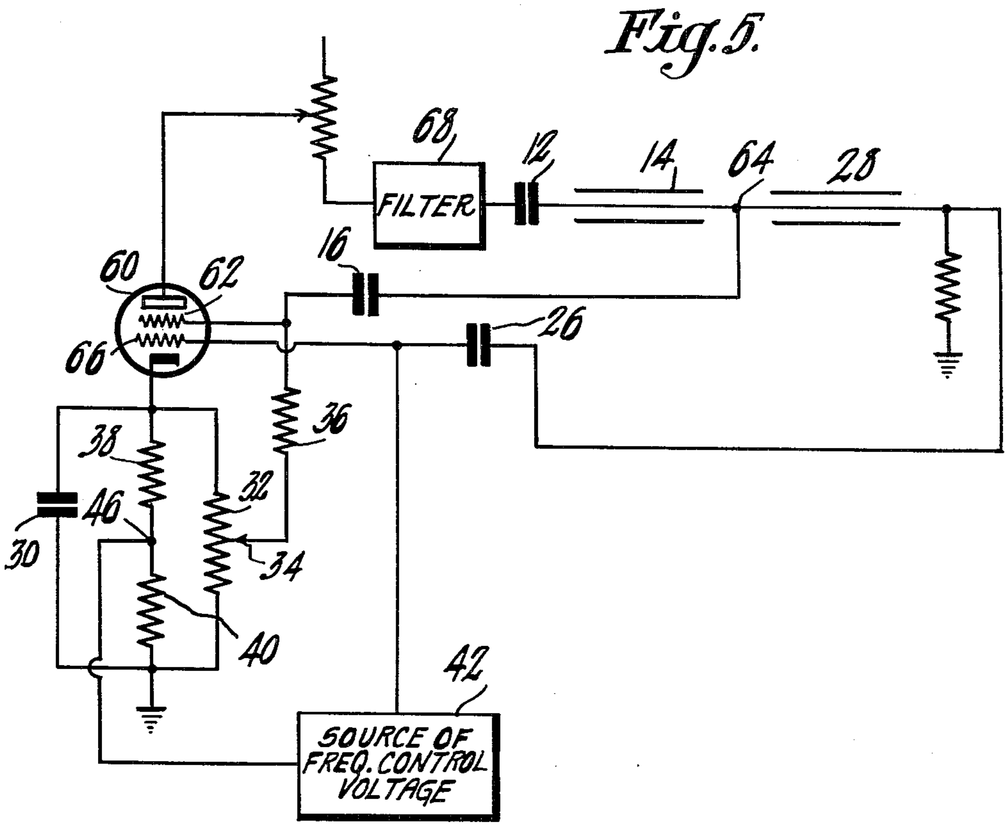
Figure 5 is a schematic circuit diagram of another embodiment of the invention using a single electron tube.

Figure 5 illustrates another arrangement constructed in accordance with the principles of this invention whereby a single multi grid tube 60 may be employed instead of two separate tubes. Corresponding components are given the same numerals as in the preceding figures for purposes of convenience. One of the grids 62 of the tube 60 is coupled to the junction 64 of the delay lines 14 and 28 via a coupling condenser 16. Another grid 66 of the tube 60 is coupled to the remote end of the delay line 28 via a coupling condenser 26. The source of frequency control voltage 42 is coupled between the grid 66 and the junction 46 of the cathode resistors 38 and 40. In the circuit arrangements previously discussed the voltages applied to the grids 6 and 22 of the separate tubes 2 and 20 were added. In the circuit of Figure 5 the voltages present on the grids 62 and 66 are multiplied in accordance with principles well known to those skilled in the art. In either arrangement, the effects of the direct current voltage components provided by the grid bias are prevented from reaching the various output circuits that are coupled at any desired point in the delay line, by the blocking action of the condenser 12. The products of the alternating voltages appearing at the grids 60 and 62 produce sum and difference frequencies at the plate of the tube 60. In addition, there appears at the plate 60 a frequency lying between the frequency of the grid 62 and the delay line 14 operating by themselves, and the frequency of the grid 66 and the delay lines 14 and 28 operating by themselves. The position of the output frequency between these limits is dependent on the relative gain of the grid 62 and the grid 66. This latter frequency is the one desired and currents of the sum and difference frequencies that lie beyond these limits are prevented from reaching the delay lines 14 and 28 by the insertion of a band pass filter 68 in series with the condenser 12 and the plate of the tube 60.

Having thus described my invention, what is claimed is:

1. An oscillator comprising in combination an amplifier having at least two grids, a plate and a cathode, a source of positive potential, a load impedance coupled between said plate and said source, a filter and a condenser and a delay line connected in series between the plate and one of said grids so as to produce oscillations of a frequency, means for coupling an intermediate point on said delay line to the other of said grids so as to produce further oscillations, said grids being mounted so that the signals applied to them are multiplied, said filter being adapted to pass only a frequency lying between the oscillation frequencies of said separate grids.

2. Apparatus as described in claim 1 wherein means are provided for inserting a frequency control voltage between one of said grids and said cathode.

3. An oscillator comprising, frequency determining apparatus consisting solely of a first delay line and a second delay line connected together, first amplifier means coupled for controlling one component of the current flowing in said frequency determining apparatus in accordance with the voltage at the output end of said first delay line, and second amplifier means coupled for controlling another component of the current flowing in said frequency determining apparatus in accordance with the voltage at the output end of said second delay line, both of said amplifier means having sufficient gain to produce oscillations having a frequency determined by the respective lengths of said delay lines and the relative amplitudes of said current components.

4. An oscillator as defined in claim 3 wherein, each of said first and second amplifier means includes an input terminal and an output terminal, the input terminals of said first and second amplifier means being respectively coupled to the output ends of said first and second delay lines, said amplifier output terminals being connected together and coupled to the input end of said first delay line, and the input end of said second delay line being connected to the output end of said first delay line.

5. An oscillator as defined in claim 3 wherein, each of said first and second amplifier means includes an electron tube, each of said tubes having an input grid and an output anode, said input grids being respectively coupled to the output ends of said first and second delay lines, said output anodes being connected together and coupled to the input end of said first delay line, and the input end of said second delay line being connected to the output end of said first delay line.

6. An oscillator as defined in claim 3 wherein, said first and second amplifier means includes first and second input terminals and an output terminal, said input terminals being respectively coupled to the output ends of said first and second delay lines, and said amplifier output terminal being coupled to the input ends of said first and second delay lines.

7. An oscillator as defined in claim 3 wherein, each of said first and second amplifier means includes an electron tube, each of said tubes having an input grid and an output anode, said input grids being respectively coupled to the output ends of said first and second delay lines, and said output anodes being connected together and coupled to the input ends of said first and second delay lines.

8. An oscillator as defined in claim 3 wherein, said first and second amplifier means includes an electron tube having first and second input grids and an output anode, said input grids being respectively coupled to the output ends of said first and second delay lines, said output anode being coupled to the input end of said first delay line, and the input end of said second delay line being connected to the output end of said first delay line.

References Cited in the file of this patent

UNITED STATES PATENTS

| | | |
|---|---|---|
| 2,262,149 | Slonczewski | Nov. 11, 1941 |
| 2,304,388 | Usselman | Dec. 8, 1942 |
| 2,346,800 | Usselman | Apr. 18, 1944 |
| 2,388,098 | Usselman | Oct. 30, 1945 |

FOREIGN PATENTS

| | | |
|---|---|---|
| 578,690 | Great Britain | July 9, 1946 |